(12) United States Patent
Cho et al.

(10) Patent No.: US 7,791,157 B2
(45) Date of Patent: Sep. 7, 2010

(54) ENERGY CONVERSION FILM AND QUANTUM DOT FILM COMPRISING QUANTUM DOT COMPOUND, ENERGY CONVERSION LAYER INCLUDING THE QUANTUM DOT FILM, AND SOLAR CELL INCLUDING THE ENERGY CONVERSION LAYER

(75) Inventors: Kyung-sang Cho, Gwacheon-si (KR); Byung-ki Kim, Gunpo-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/347,681

(22) Filed: Feb. 3, 2006

(65) Prior Publication Data

US 2006/0169971 A1    Aug. 3, 2006

(30) Foreign Application Priority Data

Feb. 3, 2005    (KR) ...................... 10-2005-0010180

(51) Int. Cl.
     *H01L 31/0216*      (2006.01)
(52) U.S. Cl. .............................. 257/436; 257/E31.119
(58) Field of Classification Search .................. 257/14, 257/103, 436, 451, E31.119; 977/950, 954
See application file for complete search history.

(56) References Cited

U.S. PATENT DOCUMENTS

| | | | |
|---|---|---|---|
| 5,389,159 A * | 2/1995 | Kataoka et al. ............. | 136/251 |
| 5,449,413 A | 9/1995 | Beauchamp et al. ........ | 136/257 |
| 6,476,312 B1 | 11/2002 | Barnham | |
| 6,501,091 B1 * | 12/2002 | Bawendi et al. ............... | 257/14 |
| 6,819,692 B2 | 11/2004 | Klimov et al. | |
| 7,326,908 B2 * | 2/2008 | Sargent et al. ........... | 250/214.1 |
| 7,358,525 B2 * | 4/2008 | Lee .............................. | 257/22 |
| 2005/0051766 A1 * | 3/2005 | Stokes et al. .................. | 257/17 |
| 2006/0118757 A1 * | 6/2006 | Klimov et al. ........ | 252/62.51 R |

OTHER PUBLICATIONS

Korean Office Action dated May 26, 2006 for Application No. 10-2005-0010180 (All references cited in Office Action are cited above).

(Continued)

*Primary Examiner*—Allan R. Wilson
(74) *Attorney, Agent, or Firm*—Cantor Colburn LLP

(57) ABSTRACT

An energy conversion film and a quantum dot film which contain a quantum dot compound, an energy conversion layer including the quantum dot film, and a solar cell including the energy conversion layer. The films act as cut-off filters blocking light of a particular energy level using the light absorption and emission effects of quantum dots and can convert high energy light to low energy light. The efficiency of a solar cell may be improved by providing the cell with a film that converts light above the spectrum-responsive region to light in the cell's spectrum-responsive region. The absorption wavelength region of the films can be broadened by providing the quantum dot compound in a variety of average particle sizes, for example, by providing a mixture of a first quantum dot compound having a first average particle size and a first quantum dot compound having a second average particle size.

13 Claims, 5 Drawing Sheets

OTHER PUBLICATIONS

"Long-Term Stability of Low-Power Dye-Sensitised Solar Cells Prepared by Industrial Methods"; Authors: Henrik Pettersson, Tadeusz Gruszeck; Solar Energy Materials & Solar Cells 70 (2001) 203-212.

"Type-II Quantum Dots: CdTe/CdSe (Core/Shell) and CdSe/ZnTe (Core/Shell) Heterostructures"; Authors: Sungjee Kim, Brent Fisher, Hans-Jurgen Eisler, and Moungi Bawendi; J. Am. Chem. Soc. 2003, 125, 11466-11467.

Type-II Quantum Dots: CdTe/CdSe(core/shell) and CdSe/ZnTe(core/shell) Heterostructures Supporting Information; Authors: Sungjee Kim, Brent Fisher, Hans-Jurgen Eisler, Moungi Bawendi; pp. S1-S3.

"Large Resonant Stokes Shift in CdS Nanocrystals"; Authors: Zhonghua Yu, Jingbo Li, Donald B. O'Connor, Lin-Want, and Paul F. Barbara; J. Phys. Chem B 2003, 107, 5670-5674.

* cited by examiner (Prior Art)

PRIOR ART

ENERGY CONVERSION FILM AND QUANTUM DOT FILM COMPRISING QUANTUM DOT COMPOUND, ENERGY CONVERSION LAYER INCLUDING THE QUANTUM DOT FILM, AND SOLAR CELL INCLUDING THE ENERGY CONVERSION LAYER

CROSS-REFERENCE TO RELATED PATENT APPLICATION

This application claims priority to Korean Patent Application No. 10-2005-00101080, filed on Feb. 3, 2005, and all the benefits accruing therefrom under 35 U.S.C. §119. Said priority application is incorporated herein in its entirety by reference.

BACKGROUND OF THE INVENTION

1. Field of the Invention

The present invention relates to an energy conversion film and a quantum dot film that contain a quantum dot compound and a quantum dot film, and more particularly, to an energy conversion film and a quantum dot film which can act as a cut-off filter blocking light of a particular energy level using the light absorption and emission effects of quantum dots and can convert high energy light to low energy light.

2. Description of the Related Art

In order to address energy-related problems faced in recent years, research has been conducted into a variety of possibilities for the replacement of the long-used fossil fuels. In particular, extensive research has been conducted to utilize natural energy such as wind energy, atomic energy, solar energy and the like as alternatives to petroleum resources that are anticipated to be exhausted within a few decades. Solar cells use solar energy, which is an unlimited energy source, unlike other energy resources, and are environmentally friendly. Thus, a selenium (Se) solar cell was developed first in 1983, and currently silicon solar cells, polymeric solar cells (for example, dye-sensitized solar cell) and the like remain popular.

Such a solar cell employs, for the purpose of improving energy output, an optical coating to reflect the portion of a solar spectrum which is not converted to electricity. When no optical coating is used, solar light beyond the spectrum-responsive region (solar light of longer or shorter wavelength than the spectrum-responsive region) is absorbed by the cell, causing the cell temperature to increase, and at the same time reducing light conversion efficiency. In this regard, solar light is used after being filtered through a filter for light having a wavelength of 350 nanometers (nm) or greater (silicon solar cell), or a wavelength of 400 nm or greater (polymeric solar cell).

U.S. Pat. No. 5,449,413 discloses silicon solar cells, especially such solar cells used in spaceships, satellites and the like, in which light in the ultraviolet region of 350 nm or less and in the infrared region is reflected on the cell surface using a multilayer-structured doped semiconductor filter. However, the complicated structure and weight of the filter cause a rise in production costs and transfer costs, and thus, lead to reduced economic efficiency. In addition, the filter filters light in a shorter wavelength region by simple reflection and thus, the energy utilization efficiency is low.

Petterson et al. discloses in an article [*Solar Energy Material and Solar Cell*, 70, 203 (2001)], the use of polyester films as examples of filters that can be used in commercial polymeric solar cells. These films can be produced at relatively low costs, but they are only capable of blocking light of wavelengths of 400 nm or less.

Therefore, there is a need for a method of increasing the efficiency of energy utilization by blocking the solar light of a wavelength region which is not electrically converted in a solar cell and simultaneously converting the light to light having a wavelength that can be used in a solar cell.

SUMMARY OF THE INVENTION

The present invention provides an energy conversion film which attains improved energy utilization efficiency by absorbing a portion of solar light that is beyond a spectrum-responsive region and converting the absorbed light.

The present invention provides a quantum dot film for use as a cut-off filter, which blocks high energy light by absorbing it.

The present invention provides an energy conversion layer including the quantum dot film.

The present invention provides a solar cell including the energy conversion layer.

According to an aspect of the present invention, there is provided an energy conversion film comprising a quantum dot compound.

The energy conversion film can absorb high energy light and convert the absorbed light to low energy light.

The quantum dot compound may be a) a first element selected from Group 2, 12, 13 and 14 of the Periodic Table of Elements and a second element selected from Group 16; b) a first element selected from Group 13 and a second element selected from Group 15; c) an element selected from Group 14; or a composite comprising one or more of the forgoing substances having core-shell structures.

Specific examples of the quantum dot compound include MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs, InSb, BP, Si and Ge, and composites of one or more of the forgoing materials having core-shell structures.

In particular, examples of single quantum dot compounds include CdSe, CdTe, CdS, ZnSe, ZnS, InP, InAs, GaN, GaP, GaAs, HgTe, Si and Ge. Examples of the composites having core-shell structures include CdS/ZnSe, CdS/ZnS, CdSe/ZnS, CdSe/CdS, CdSe/ZnSe, CdTe/ZnS, CdTe/CdSe, CdSe/ZnTe, and the like.

An average diameter of the quantum dot may be in a range of about 1.0 to about 10 nm. A thickness of the quantum dot film may be in a range of between about 20 nm and about 10 µm.

The energy conversion film may have a Stokes shift value of about 20 nm or greater between absorption energy and emission energy.

In the energy conversion film, the quantum dot compound may optionally be mixed or embedded in a matrix of an inorganic substance or a polymer resin.

According to another aspect of the present invention, there is provided a quantum dot film for use as a cut-off filter, the quantum dot film comprising such a quantum dot compound as described above.

According to another aspect of the present invention, there is provided an energy conversion layer having at least one quantum dot film described above.

According to another aspect of the present invention, there is provided a solar cell comprising a conductive substrate, the above-described energy conversion layer formed on at least one side of the substrate, a light absorption layer, and a counter electrode.

A method for improving the efficiency of a solar cell having a spectrum-responsive region when the solar cell is exposed to light above the spectrum-responsive region may comprise providing the solar cell with a quantum dot film capable of converting light above the spectrum-responsive region to light in the spectrum-responsive region.

A method for broadening the absorption wavelength region of an energy conversion film comprising a first quantum dot compound may comprise providing the first quantum dot compound in a variety of particle sizes.

A method for making a quantum dot film may comprise forming the film from a plurality of first quantum dot compositions having different average particle sizes from each other.

A quantum dot compound may comprise the mixture of a first quantum dot compound having a first average particle size and a first quantum dot compound having a second average particle size.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
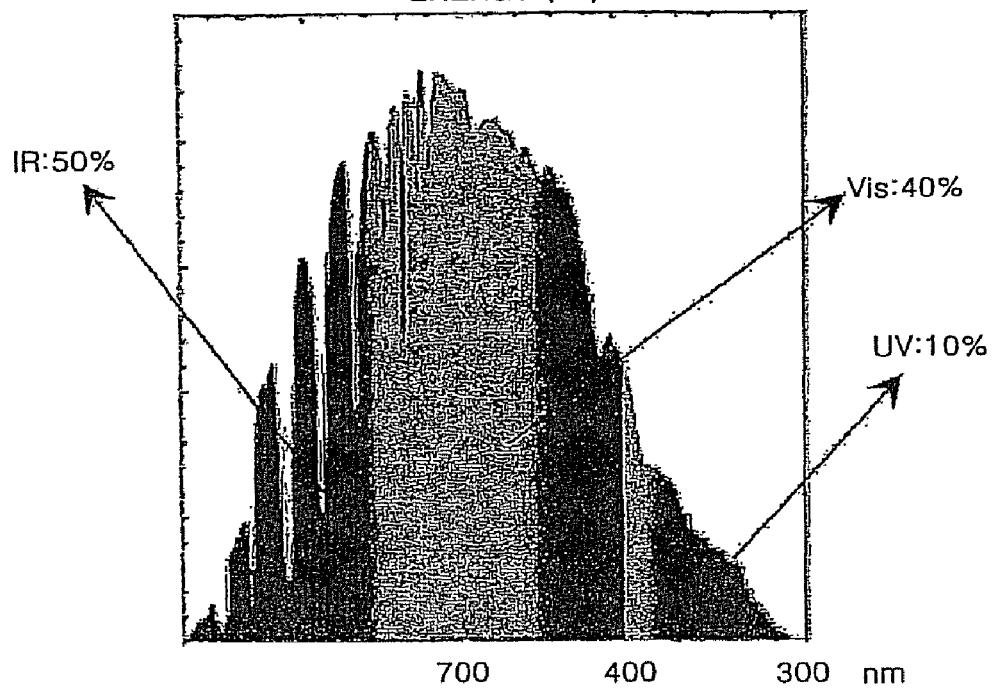
FIG. 1 is a diagram illustrating the energy distribution of solar light reaching the earth.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The modifier "about" used in connection with a quantity is inclusive of the stated value and has the meaning dictated by the context (e.g., includes the degree of error associated with measurement of the particular quantity or indicates a flexibility of the quantity in specific embodiments for attainment of a desired characteristic associated with that value).

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

One embodiment of the present invention relates to an energy conversion film that blocks an incident light of a specific wavelength band, such as solar light, by absorbing it and emitting the energy therefrom as light having a lower energy wavelength than the absorbed light. For ease of expression, this process is referred to as "converting" the absorbed light into the emitted light, or as emitting the absorbed light as lower energy light. For example, the energy conversion film may absorb ultraviolet rays and convert them into visible light or the like.

For this purpose, the energy conversion film according to the present invention contains a quantum dot compound. Examples of quantum dot compounds include: a) a first element selected from Group 2, 12, 13 or 14 of the Periodic Table of Elements and a second element selected from Group 16; b) a first element selected from Group 13 and a second element selected from Group 15; and c) an element selected from Group 14; composites comprising at least one of the forgoing substances having core-shell structures, etc.

More specifically, non-limiting examples of quantum dot compounds include MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AlN, AlP, AlAs, AlSb, GaN, GaP, GaAs, GaSb, InN, InP, InAs, InSb, BP, Si and Ge, and composites comprising at least one of the forgoing substances having core-shell structures.

In particular, examples of single quantum dot compounds include CdSe, CdTe, CdS, ZnSe, ZnS, InP, InAs, GaN, GaP, GaAs, HgTe, Si and Ge. Examples of the composites having core-shell structures include CdS/ZnSe, CdS/ZnS, CdSe/ZnS, CdSe/CdS, CdSe/ZnSe, CdTe/ZnS, CdTe/CdSe, CdSe/ZnTe, and the like.

Such quantum dot compounds absorb light in a higher energy band with peak absorbance at a particular wavelength, and thus can block light in a high-energy wavelength band. Quantum dot compounds also emit the absorbed light in a low energy region, thereby causing luminescence.

FIG. 1 illustrates the energy distribution of the sunlight reaching the earth. Ultraviolet rays can be converted into visible light and thus increase the energy of visible light in sunlight in a region of 300 nm to 700 nm by about 20%. In general, the maximum emission efficiency of quantum dot compounds reaches about 40% to about 95%, so when the energy conversion film according to the present invention is used in a solar cell, the energy conversion efficiency in the visible light band can increase up to about 10%.

The absorption wavelength region of the energy conversion film can be adjusted by controlling the particle size of the quantum dot compound therein. That is, absorption wavelength region in the UV light band and emission wavelength regions in the visible light band, can be selectively controlled by adjusting the particle size of the above-described quantum dot compound. Therefore, when such a quantum dot compound is used for an energy conversion film, desired energy conversion can be achieved, and thus the energy conversion film can be utilized for various purposes.

A quantum dot compound in the energy conversion film may have an average particle diameter of about 1.0 nm to about 10 nm. When the average particle diameter is less than about 1.0 nm, it is difficult to prepare a quantum dot compound, which would be unstable even when it can be prepared. When the average particle diameter exceeds about 10 nm, a desired quantum confinement effect, which depends on the size of quantum dots, cannot be obtained.

When forming the energy conversion film on a substrate using such a quantum dot compound, various methods can be used. The thickness of the energy conversion film may be about 20 nm to about 10 mircometers (μm). When the thickness is less than about 20 nm, the light absorption by the energy conversion film is too small to block light, and effectively convert energy. When the thickness is larger than about 10 μm, the energy conversion film can absorb a large amount of light and satisfactorily block light, but a large quantity of quantum dots is required, making the film uneconomical and creating the risk that the emitted lower energy light may be reabsorbed or dispersed.

When forming an energy conversion film according to the present invention, such a quantum dot compound in particle form can be directly incorporated into a substrate or can be used after being mixed or embedded in a matrix of an inorganic material or a polymer resin. For the matrix of inorganic material, glass, oxides, semiconductor substances with large band gaps, or the like, but not limited thereto, can be used. Using a polymer resin, the binding force to the substrate can be enhanced, the energy conversion film can be easily formed, and the stability of the energy conversion film increases. For the polymer resin, epoxy resins, polystyrene, polypropylene, or the like, but not limited thereto, can be used.

The energy conversion film according to the present invention converts high energy light to low energy light. A stokes shift value indicates a difference between the maximum absorption wavelength in a high-energy region and the maximum emission wavelength in a low energy region. The stokes shift value of the energy conversion film described herein may be about 20 nm or greater. When the stokes shift value is less than about 20 nm, the converted energy is reabsorbed, thereby lowering energy conversion efficiency. Furthermore, it is also difficult to convert absorbed UV rays to visible light. In particular, a CdS quantum dot compound is known as a substance having a large resonance stokes shift (See *J. Phys. Chem. B*, 107, 5670 (2003)). Recently, there is an example of producing a core-shell quantum dot compound having a stokes shift value of about 200 nm or greater by allowing a type II core-shell film to selectively restrict carriers (electrons or holes) (See *J. Am. Chem. Soc.*, 125, 11466 (2003)).

An energy conversion film can be prepared by applying particles of a quantum dot compound to a substrate such as quartz or glass using a method such as spin coating, drop casting, sedimentation, solvent evaporation, self-assembly, or the like.

In one embodiment, an energy conversion film according to the invention may contain a single quantum dot compound. Commercially available quantum dot compounds can be used without limitation. It is also possible to use quantum dot compounds having core-shell structures or inversed core-shell structures. Any commercially available quantum dot compounds with core-shell structures can be used without limitation. In some embodiments quantum dot compounds having core-shell structures or having inversed core-shell structures are employed to improve the physical properties of the energy conversion film When a core-shell structured quantum dot compound is not available or when a quantum dot compound with a new structure is required, the desired quantum dot compound can be synthesized as follows.

In general, quantum dot compounds with core-shell structures can be prepared using a wet chemical synthesis method. In one method, quantum dots coordinated in the dispersion solvent are synthesized using a dispersion solvent and a single precursor. The dispersion solvent should be able to stably disperse quantum dots. In other words, the dispersion solvent should be able to coordinate individual quantum dots, should have a molecular size that is large enough to control the crystal growth rate, and should be able to stably disperse the coordinated quantum dots in a colloid state at a crystal growth temperature. Examples of such solvents include alkylphosphine, alkylphosphine oxide, alkylamine, or a mixture of at least two of these solvents, etc. In such solvent, a phosphorus atom, phosphate, or a nitrogen atom serves to coordinate the surfaces of quantum dots, and the alkyl group may have 8 or more carbon atoms to increase the boiling point and the molecular size of the solvent. Such solvents are relatively stable in air but may oxidize at a high temperature. Accordingly, an inert atmosphere should be maintained during reaction, under pressure, if necessary. The reaction temperature affects the crystal growth rate and thus can be about 25° C. to about 350° C. in consideration of the characteristics of a quantum dot precursor. Methods of synthesizing quantum dots using a precursor include a method of separately adding a metal precursor or a chalcogenide precursor for reaction and a method of thermal decomposition using a single precursor.

In one embodiment, all quantum dot precursors are quickly and simultaneously injected into a dispersion solvent while the temperature of a reaction system containing the dispersion solvent is maintained at a certain level. For this purpose, the precursors may be dissolved in a specific solvent to allow rapid and homogeneous dispersion in the dispersion solvent, and the viscosity of the precursor solution has to be adjusted to enable control of the injection speed. The specific solvent should not decompose during reaction, should be able to solublize the precursors, and should allow easy viscosity adjustment. Examples of the specific solvent include pyridine, alkylamines, and alkylphosphines. The reaction yields quantum dot cores.

Once quantum dot cores are formed through the reaction, an inorganic precursor for forming shells on the surfaces of the cores is further injected into the dispersion solvent. The precursor should be slowly injected into the reaction system, and the amount of the precursor should limited to a level such that the precursor can be deposited on the surfaces of the cores and not form nuclei.

When desired core-shell structured quantum dots are formed, the temperature of the reaction solvent is abruptly decreased to stop the crystal growth of the quantum dots. To this end, an organic solvent having a low boiling point is added to absorb heat from the dispersion solvent, optionally including absorbing heat of varporization, and lower the temperature of the reaction system, thereby suppressing the crystal growth by adjusting the amount of the dispersion solvent. The size of the quantum dots can be controlled by varying the reaction time.

The synthesized quantum dots are dispersed in a colloid state in the dispersion solvent. The quantum dots are separated from the solvent by centrifugation. In this process, the homogeneity of the quantum dots, which have a size distribution after being synthesized, can be increased using selective precipitation. In selective precipitation, the precipitation rate is controlled during centrifugation by varying the characteristics of a capping material which is substituted on the surfaces of the quantum dots and the ratio of a solvent with high affinity to a solvent with poor affinity to the quantum dots in order to sort quantum dot sizes. Since the surfaces of the quantum dots are coordinated with the dispersion solvent used for the synthesis, the quantum dots can be easily dispersed in most organic solvents.

The shapes of the synthesized quantum dots vary according to the reaction conditions. For example, the quantum dots may have spherical, polar, or star shapes. Nano-matrices having various physical properties can be manufactured using such quantum dots.

The energy conversion film according to the present invention has a stokes shift value of 20 nm or greater, which is an indicative of its high energy conversion efficiency. The energy conversion film according to the present invention is useful as an energy conversion layer. That is, when an energy conversion layer includes the energy conversion film, the energy conversion layer can convert high-energy UV rays to low-energy visible light and thus can be effectively utilized in a solar cell or the like.

An energy conversion film can be formed as a single layer, or optionally, as multiple layers in which light blocking regions and energy conversion regions can be differently defined to improve light absorption and emission efficiencies. For example, an energy conversion film including multiple layers can be formed on at least one surface of a substrate.

Although a single quantum dot compound is used to form an energy conversion film, absorption and emission regions can be differently defined in the energy conversion film by varying the particle size of the quantum dot compound, as descried above. Thus, the light absorption and emission efficiencies of an energy conversion film can be improved by forming the film as multiple layers.

The energy conversion film containing a quantum dot compound as descried above can perform energy conversion and a light cut-off function and thus can be used as a cut-off filter. Therefore, the present invention provides a quantum dot film for use as a cut-off filter.

The quantum dot film according to the present invention contains a quantum dot compound. Any quantum dot compound described above can be used for the quantum dot film.

The quantum dot film for use as a cut-off filter according to the present invention has an energy conversion function as well as a cut-off filter function Therefore, the quantum dot film is used as an energy conversion layer. The energy conversion layer using the quantum dot film can be used in various fields requiring light blocking and energy conversion, for example, in a solar cell, an energy-saving window, a light energy conversion photoelectric device, etc.

When the energy conversion layer according to the present invention is used in a solar cell, the energy conversion layer can block high energy UV light and simultaneously convert the UV light to low energy visible light, which can be electrically used. As a result, it is possible to suppress a temperature rise in the cell caused by the absorption of the UV light and enable efficient energy utilization, thereby improving photoelectric conversion efficiency.

Figure 2A:
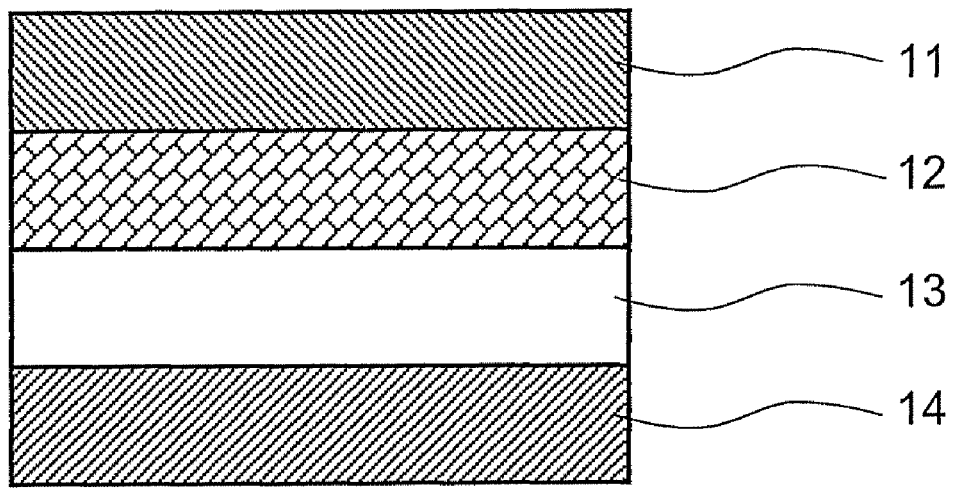
FIG. 2a is a schematic diagram illustrating the structure of a dye-sensitized solar cell according to the prior art.

FIG. 2a illustrates the structure of a prior art dye-sensitized solar cell. Referring to FIG. 2a, the dye-sensitized solar cell includes a conductive transparent substrate 11, a light absorption layer 12, an electrolyte layer 13, and a counter electrode 14. The light absorption layer 12 contains a metal oxide and a dye. The dye is excited by absorbing light passing through the conductive transparent substrate 11. In general, a complex, such as a ruthenium dye, can be used for the dye.

Figure 2B:
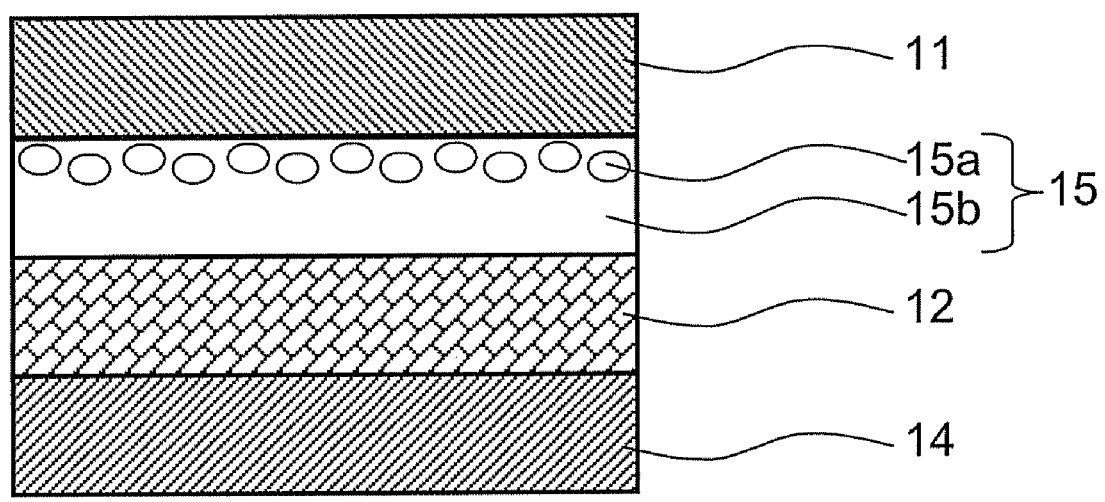
FIG. 2b is a schematic diagram illustrating the structure of an exemplary solar cell according to an embodiment of the present invention.

FIG. 2b illustrates the structure of an exemplary solar cell according to an embodiment of the present invention, comprising a conductive substrate 11, an energy conversion layer 15 having quantum dot film 15a and inorganic or organic matrix 15b formed on at least one side of the substrate 11, a light absorption layer 12, and a counter electrode 14. A separate electrolyte layer 13 (not shown in FIG. 2b) may also be included between light absorption layer 12 and counter electrode 14. An energy conversion layer (12a, FIG. 2b) according to the present invention including the quantum dot film for use as a cut-off filter can be formed on at least one surface of the conductive transparent substrate 11. The energy conversion layer blocks light of a high energy wavelength and simultaneously converts the high energy light to light of a low energy wavelength, thereby improving the photoelectric conversion efficiency.

Any common constituent for solar cells can be used in the present invention without limitation.

Any dye commonly used in solar cells or photoelectric cells can be used for the dye in the light absorption layer 12 without limitation. For example, a ruthenium complex may be used as the dye. However, any dye that can separate charges and that is light-sensitive can be used without limitation. In addition to the ruthenium complex, examples of e suitable dyes include: xanthene dyes, such as Rhodamine B, Rose Bengal, eosin, erythrosine, etc.; cyanine dyes, such as quinocyanine, cryptocyanine, etc.; basic dyes, such as phenosafranine, Capri Blue, thiosine, methylene blue, etc.; porphyrin compounds, such as chlorophyll, zinc porphyrin, magnesium porphyrin, etc.; other azo dyes; phthalocyanine compounds; complexes, such as Ru-trisbipyridine, etc.; anthraquinone dyes; and multicyclic quinine dyes, etc., which can be used individually or as a mixture of at least two compounds. Examples of suitable ruthenium complexes include $RuL_2(SCN)_2$, $RuL_2(H_2O)_2$, $RuL_3$, $RuL_2$, where L is 2,2'-bipyridyl-4,4'-dicarboxylate, etc.

The metal oxide contained in the light absorption layer 12 can be a semiconductor material in microparticles, such as $TiO_2$, $SnO_2$, $ZnO$, $WO_3$, $Nb_2O_5$, $TiSrO_3$. $TiO_2$ in anatase is preferred as the metal oxide. Examples of the semiconductor material are not limited to the above-listed semiconductor materials, which can be used individually or as in combination of at least two. Such semiconductor microparticles may have a larger surface area to allow the dye adsorbed on their surfaces to absorb a large amount of light. For this purpose, the semiconductor microparticles may have a particle diameter of about 20 nm or less.

The conductive transparent substrate 11 used in the present invention may be any transparent substrate, such as a glass substrate, etc. For a material which imparts conductivity to the transparent substrate, any material exhibiting conductivity and transparency can be employed. However, for higher conductivity, transparency and, especially, higher heat-resistance, tin oxides, for example, $SnO_2$, etc., are suitable. Meanwhile, for cost reduction, indium tin oxide (ITO), preferably, fluorine-doped indium tin oxide (FTO), can be used.

The thickness of the light absorption layer 12 containing the metal oxide and dye may be 15 µm or less. This is because the light absorption layer 12 has a large series resistance due to its structure and thus leads to a decrease in conversion efficiency. However, when the light absorption layer 12 is formed to have a thickness of about 15 µm or less, the series resistance of the light absorption layer 12 can be maintained low while the light absorption layer 12 normally functions, thereby preventing a decrease in conversion efficiency.

The electrolyte layer 13 is composed of an electrolyte. The electrolyte layer 13 can be separately formed from the light absorption layer 12. Alternatively, instead of separately forming the electrolyte layer 13, an electrolyte can be infiltrated into the light absorption layer 12. An example of the electrolyte that can be used in the present invention includes, but not limited to, an acetonitrile solution of iodine or the like. Any electrolyte having a hole transfer function can be used without limitation.

The counter electrode 14 can be formed of any conductive material without limitation. The counter electrode 14 can be formed of an insulating material layer with a conductive layer on a side facing a semiconductor electrode. In some embodiments, electrochemically stable materials, for example, platinum, gold, carbon, etc., may be used for the counter electrode 1. To improve a catalytic effect in oxidation and reduction, a side of the counter electrode 14 facing the semiconductor electrode may have a microporous structure with a larger surface area. For example, platinum can be used in platinum black form, and carbon can be used in porous form. A platinum black can be obtained by treating platinum by anodization or using chloro platinic acid. A porous carbon can be obtained by, for example, sintering carbon microparticles, calcinating an organic polymer, etc.

A method of manufacturing the dye-sensitized solar cell according to the invention having the above-described structure is not limited, and any conventional method can be used to form the dye-sensitized solar cell according to the present invention can be used without limitation.

Hereinafter, the invention will be explained in more detail with reference to the following examples. The following examples are only for illustrative purposes and are not intended to limit the present invention.

Example 1

A film having a thickness of 420 nm was formed on a glass substrate by spin coating using CdS having an average particle diameter of 2.3 nm as a quantum dot compound.

Example 2

A film having a thickness of 450 nm was formed on a glass substrate by spin coating using CdS having an average particle diameter of 3.2 nm as a quantum dot compound.

Example 3

A film having a thickness of 470 nm was formed on a glass substrate by spin coating using CdS having an average particle diameter of 4.2 nm as a quantum dot compound.

Experimental Example 1

Figure 3:
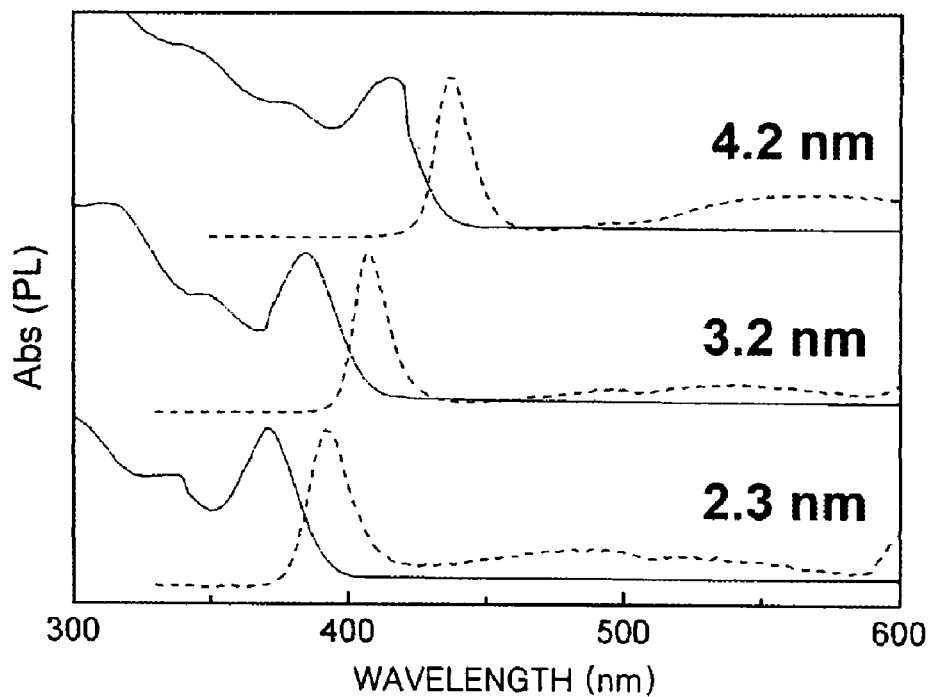
FIG. 3 is a graph illustrating the absorbance and photoluminescence of quantum dot films of Examples 1 through 3 according to specific embodiments of the present invention.
Figure 5:
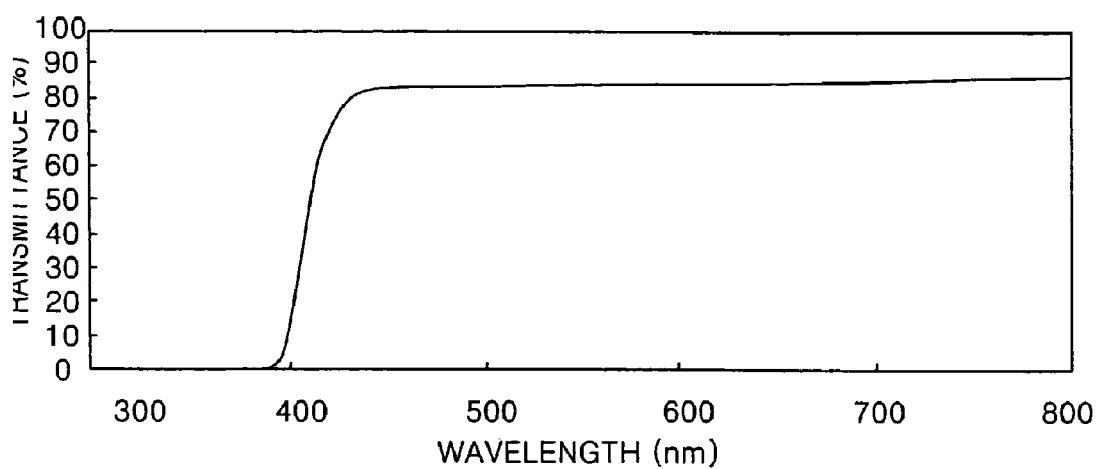
FIG. 5 is a graph illustrating the transmittance of a polyester film according to the prior art.
Figure 6:
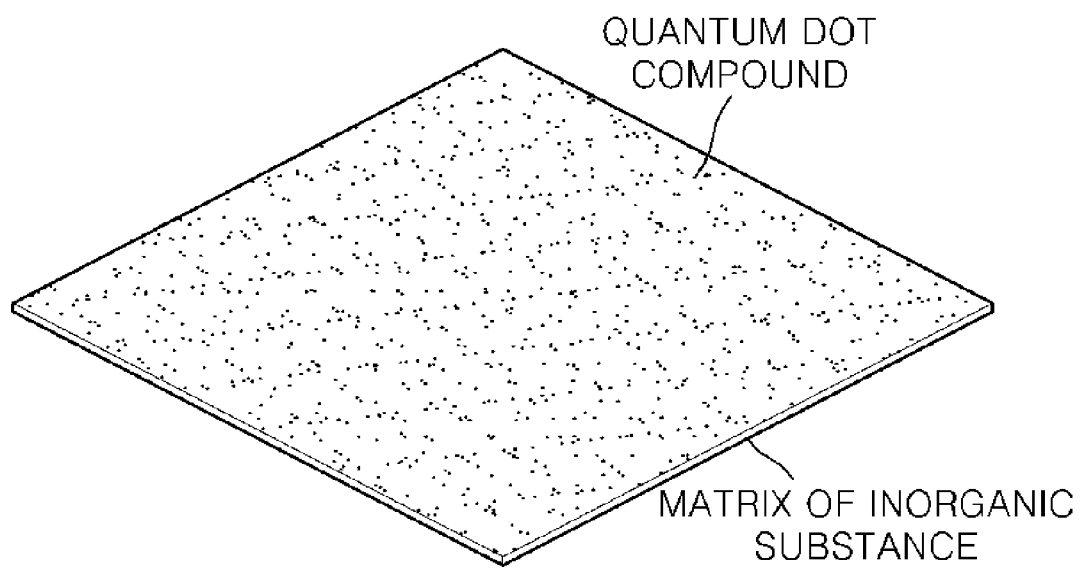

The absorbance and photoluminescence of each of the films obtained in Examples 1 through 3 were measured. The results are shown in FIG. 3. The transmittance of the cut-off filter was measured using the polyester film of Comparative Example. The results are shown in FIG. 5.

As can be seen from FIG. 3, the films according to the invention show maximum absorbances in the vicinity of a wavelength of 400 nm. The absorbance of each of the films constantly increases as the energy increases. This demonstrates that the films according to the present invention can be used as an effective cut-off filter to block energy of a certain wavelength band. Such a property of absorbing light and emitting the absorbed light in a lower energy region means that the films according to the present invention are capable of converting high energy UV light to visible light.

Figure 4:
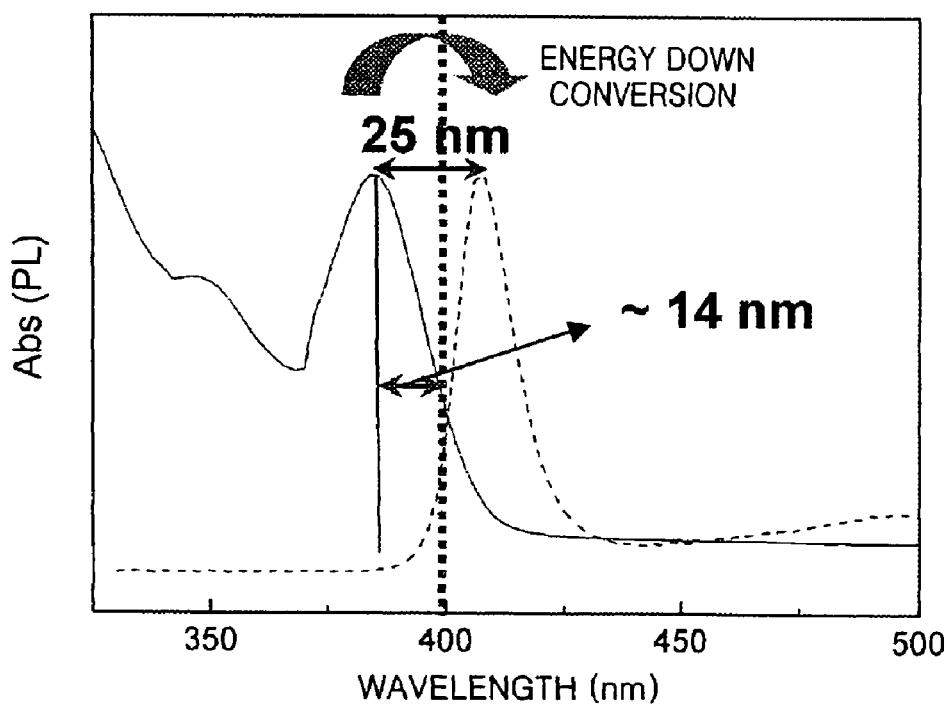
FIG. 4 is a graph illustrating the absorbance and photoluminescence of the quantum dot film of Example 2.

In particular, a magnified view of the film of Example 2, which was obtained using a quantum dot compound having a particle size of 3.2 nm, is shown FIG. 4. Referring to FIG. 4, the film has a maximum absorbance near 409 nm, and the absorbance increases as the energy increases. The full width at half maximum (FWHM) of the absorbance peak is about 30 nm, and the increase in the absorbance is rapid in a similar manner as in FIG. 5, which shows the absorbance of the cut-off filter using the polyester film, proving the effect of the film according to the present invention as a filter blocking high energy UV light. In addition, such a property of absorbing light of 409 nm and emitting the absorbed light at 430 nm or greater means that the film has the energy downconversion effect of converting high energy UV light to visible light. In particular, the stokes shift value reaches 25 nm, indicating excellent conversion efficiency.

As described above, an energy conversion film and a quantum dot film according to the present invention can block solar light of unnecessary regions and converts the blocked light into electrically useful visible light. In particular, when the energy conversion film and the quantum dot film can be effectively used as energy conversion layers in solar cells or the like. Solar cells prepared using these films have high light conversion efficiency and are light in weight, and thus can be efficiently in general applications as well as in applications related to the space industry.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A solar cell comprising a conductive substrate, an energy conversion layer comprising a quantum dot compound and formed on at least one side of the substrate,
   a light absorption layer, and
   a counter electrode,
   wherein the thickness of the energy conversion layer is about 20 nm to about 10 µm, and the solar cell is configured to generate an electric current upon absorbing light.

2. The solar cell of claim 1 wherein the quantum dot compound has a core-shell structure or an inverse core-shell structure.

3. The energy conversion film solar cell of claim 1 wherein the energy conversion layer comprises multiple layers formed on at least one surface of a substrate.

4. The solar cell of claim 1, wherein the energy conversion layer absorbs light and converts the absorbed light to a lower energy light, and the light absorption layer is excited by absorbing the lower energy light.

5. The solar cell of claim 1, wherein the quantum dot compound is a substance selected from the group consisting of a) a combination of a first element selected from Group 2, 12, 13 and 14 of the Periodic Table of Elements and a second element selected from Group 16; b) a combination of a first element selected from Group 13 and a second element selected from Group 15; c) an element selected from Group 14; or (d a composite comprising one or more of the forgoing compounds having core-shell structures.

6. The solar cell of claim 1, wherein the quantum dot compound is MgO, MgS, MgSe, MgTe, CaO, CaS, CaSe, CaTe, SrO, SrS, SrSe, SrTe, BaO, BaS, BaSe, BaTe, ZnO, ZnS, ZnSe, ZnTe, CdO, CdS, CdSe, CdTe, HgO, HgS, HgSe, HgTe, $Al_2O_3$, $Al_2S_3$, $Al_2Se_3$, $Al_2Te_3$, $Ga_2O_3$, $Ga_2S_3$, $Ga_2Se_3$, $Ga_2Te_3$, $In_2O_3$, $In_2S_3$, $In_2Se_3$, $In_2Te_3$, $SiO_2$, $GeO_2$, $SnO_2$, SnS, SnSe, SnTe, PbO, $PbO_2$, PbS, PbSe, PbTe, AN, AlP, AlAs, AlSb, GaN, GaP, GaAs, GaSb, InN, InP, InAs, InSb, BP, Si and Ge, or a composite comprising one or more of the forgoing materials having core-shell structures.

7. The solar cell of claim 6, wherein the quantum dot compound is CdSe, CdTe, CdS, ZnSe, ZnS, InP, InAs, GaN, GaP, GaAs, HgTe, Si, Ge, CdS/ZnSe, CdS/ZnS, CdSe/ZnS, CdSe/CdS, CdSe/ZnSe, CdTe/ZnS, CdTe/CdSe, or CdSe/ZnTe, or a combination comprising one or more of the foregoing components.

8. The solar cell of claim 1, wherein the energy conversion layer comprises an energy converting film having a Stokes shift value between absorption energy and emission energy of about 20 nm or greater.

9. The solar cell of claim 1, wherein the quantum dot compound is mixed or embedded in a matrix of an inorganic substance or a polymer resin.

10. The solar cell of claim 1, wherein an average diameter of the quantum dot is about 1.0 nm to about 10 nm.

11. The solar cell of claim 1, wherein the light absorption layer does not comprise a quantum dot compound.

12. The solar cell of claim 1, wherein the light absorption layer comprises a metal oxide and a dye.

13. The solar cell of claim 1, wherien further comprising an electrolyte.

* * * * *